United States Patent
Park et al.

(10) Patent No.: US 11,094,793 B2
(45) Date of Patent: Aug. 17, 2021

(54) THIN FILM TRANSISTOR SUBSTRATE, SHIFT REGISTER AND DISPLAY DEVICE

(71) Applicant: LG Display Co., Ltd., Seoul (KR)

(72) Inventors: SeHee Park, Paju-si (KR); InTak Cho, Paju-si (KR); DaeHwan Kim, Paju-si (KR); JuHeyuck Baeck, Paju-si (KR); Jiyong Noh, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 23 days.

(21) Appl. No.: 16/538,587

(22) Filed: Aug. 12, 2019

(65) Prior Publication Data
US 2020/0052085 A1   Feb. 13, 2020

(30) Foreign Application Priority Data

Aug. 13, 2018 (KR) .................. 10-2018-0094458

(51) Int. Cl.
| | |
|---|---|
| H01L 29/49 | (2006.01) |
| H01L 29/786 | (2006.01) |
| H01L 27/12 | (2006.01) |
| G09G 3/3266 | (2016.01) |
| G11C 19/28 | (2006.01) |
| G09G 3/3225 | (2016.01) |
| G09G 3/3233 | (2016.01) |

(52) U.S. Cl.
CPC ....... *H01L 29/4908* (2013.01); *G09G 3/3225* (2013.01); *G09G 3/3233* (2013.01); *G09G 3/3266* (2013.01); *G11C 19/28* (2013.01); *H01L 27/1225* (2013.01); *H01L 29/78633* (2013.01); *G09G 2300/0408* (2013.01); *G09G 2300/0426* (2013.01); *G09G 2310/0286* (2013.01)

(58) Field of Classification Search
CPC .......... H01L 29/7869; H01L 29/78696; H01L 29/78693; H01L 29/78648; H01L 29/78606; H01L 29/4908; H01L 29/78609; H01L 29/78675; H01L 29/78633; H01L 27/1225; H01L 21/02565; H01L 21/02554; H01L 27/1218; H01L 29/78603; G09G 3/3266; G09G 3/3225; G09G 3/3233; G09G 2310/0286; G11C 19/28
See application file for complete search history.

(56) References Cited

U.S. PATENT DOCUMENTS

| | | | |
|---|---|---|---|
| 7,816,727 B2 | 10/2010 | Lai et al. | |
| 2011/0090184 A1* | 4/2011 | Yamazaki | G09G 3/36 345/204 |
| 2014/0008647 A1* | 1/2014 | Yamazaki | H01L 29/24 257/43 |

(Continued)

FOREIGN PATENT DOCUMENTS

KR   10-2009-0023197 A   3/2009

*Primary Examiner* — Xuemei Zheng
(74) *Attorney, Agent, or Firm* — Birch, Stewart, Kolasch & Birch, LLP

(57) ABSTRACT

A thin film transistor substrate can include a first buffer layer disposed on a base substrate; a second buffer layer disposed on the first buffer layer; a semiconductor layer disposed on the second buffer layer; and a gate electrode spaced apart from the semiconductor layer, at least a part of the gate electrode overlapping with the semiconductor layer, in which a surface oxygen concentration of the first buffer layer is higher than a surface oxygen concentration of the second buffer layer.

15 Claims, 11 Drawing Sheets

(56) References Cited

U.S. PATENT DOCUMENTS

2016/0118501 A1\* 4/2016 Nabatame ......... H01L 21/02631
                                                    257/43
2016/0343866 A1\* 11/2016 Koezuka ............. H01L 27/1225
2017/0288060 A1\* 10/2017 Park .................... H01L 29/7869

\* cited by examiner

THIN FILM TRANSISTOR SUBSTRATE, SHIFT REGISTER AND DISPLAY DEVICE

CROSS-REFERENCE TO RELATED APPLICATIONS

This application claims the priority benefit of Korean Patent Application No. 10-2018-0094458 filed in the Republic of Korea on Aug. 13, 2018, the entirety of which is incorporated herein by reference for all purposes as if fully set forth herein.

BACKGROUND

Technical Field

The present disclosure relates to a thin film transistor substrate comprising a thin film transistor capable of preventing a leakage current, a shift register, and a display device.

Description of the Related Art

With the advancement of multimedia, the importance of a display device has been increased. Recently, flat display devices, such as a liquid crystal display device, a plasma display device, and an organic light emitting display device, have been widely utilized.

A gate driver of the flat display device includes a shift register configured to sequentially supply a gate pulse to a plurality of gate lines. The shift register includes a plurality of stages comprising a plurality of transistors, in which the stages are cascade-connected to sequentially output the gate pulse.

In situation of the liquid crystal display device or the organic light emitting display device, a transistor included in a shift register of a gate driver is provided as a thin film transistor type in a substrate of a display panel, which is referred to as a gate in panel (GIP) structure.

The thin film transistor included in the shift register of the GIP structure supplies the gate pulse to the thin film transistor for each pixel arranged in an active area. Thus, it is desirable for the thin film transistor to have electrical reliability and endurance capable of maintaining a long lifespan as well as fundamental transistor properties, such as mobility and leakage current.

A semiconductor layer of the thin film transistor included in the shift register of the GIP structure may be formed of amorphous silicon or polycrystalline silicon (polysilicon). If using the amorphous silicon, it has advantages of simplified film formation process and reduced manufacturing cost, however, it is difficult to secure electrical reliability. If using the polysilicon, it is difficult to apply a large-sized display device due to a high process temperature, and it is difficult to secure uniformity in accordance with a crystallization method. In order to overcome these problems, a method of using oxide semiconductor for a semiconductor layer of a transistor has been studied.

The oxide semiconductor is considered as a stabilized material with amorphous type. If the oxide semiconductor is used for a semiconductor layer of a thin film transistor, it is possible to manufacture a transistor at a low temperature by the use of related art equipment without additional equipment, and it is possible to omit an ion implantation process.

However, the oxide semiconductor transistor generally has a negative threshold voltage, whereby a leakage current is generated even at 0 (zero) gate voltage (Vg). Due to the leakage current, a normal gate pulse is not provided from the shift register. Accordingly, a method for preventing the leakage current in the oxide semiconductor transistor of the shift register has been desired.

Technology Document

1. Korean Patent Application Publication No. 10-2009-0023197 (Mar. 4, 2009) entitled HIGH-K CAPPED PREVENTION DIELECTRIC BANDGAP ENGINEERED SONOS AND MONOS.

BRIEF SUMMARY

The present disclosure has been made in view of the above problems, and it is an object of the present disclosure to provide a thin film transistor substrate including a thin film transistor capable of preventing a leakage current.

It is another object of the present disclosure to provide a shift register including a thin film transistor capable of preventing a leakage current.

It is a further object of the present disclosure to provide a display device including a thin film transistor capable of preventing a leakage current.

In accordance with an aspect of the present disclosure, the above and other objects can be accomplished by the provision of a thin film transistor substrate including a substrate, a first buffer layer on the substrate, a second buffer layer on the first buffer layer, a semiconductor layer on the second buffer layer, and a gate electrode spaced apart from the semiconductor layer, at least a part of the gate electrode overlapping with the semiconductor layer, in which a surface oxygen concentration of the first buffer layer is higher than a surface oxygen concentration of the second buffer layer.

A dipole moment is formed between the first buffer layer and the second buffer layer.

The first buffer layer includes an ion bond, and the second buffer layer includes a covalent bond, in which a metal is involved in the ion bond.

The semiconductor layer includes an oxide semiconductor material.

The semiconductor layer includes a first semiconductor layer on the buffer layer, and a second semiconductor layer on the first semiconductor layer.

The thin film transistor substrate further includes a first gate insulating film on the semiconductor layer, and a second gate insulating film on the first gate insulating film, in which a surface oxygen concentration of the second gate insulating film is higher than a surface oxygen concentration of the first gate insulating film.

A dipole moment is formed between the first gate insulating film and the second gate insulating film.

The first gate insulating film includes a covalent bond, and the second gate insulating film includes an ion bond, in which a metal is involved in the ion bond.

In accordance with another aspect of the present disclosure, there is provided a thin film transistor substrate including a semiconductor layer on a substrate, a first gate insulating film on the semiconductor layer, a second gate insulating film on the first gate insulating film, and a gate electrode on the second gate insulating film, in which a surface oxygen concentration of the second gate insulating film is higher than a surface oxygen concentration of the first gate insulating film.

A dipole moment is formed between the first gate insulating film and the second gate insulating film.

In accordance with another aspect of the present disclosure, there is provided a thin film transistor substrate including a substrate, a shift register on the substrate, and a pixel connected with the shift register, in which the shift register includes a stage connected with the pixel through a gate line, in which the stage includes at least one thin film transistor, in which the thin film transistor includes a first buffer layer on the substrate, a second buffer layer on the first buffer layer, a semiconductor layer on the second buffer layer, and a gate electrode spaced apart from the semiconductor layer, at least a part of the gate electrode overlapping with the semiconductor layer, in which a surface oxygen concentration of the first buffer layer is higher than a surface oxygen concentration of the second buffer layer.

A dipole moment is formed between the first buffer layer and the second buffer layer.

The first buffer layer includes an ion bond, and the second buffer layer includes a covalent bond, in which a metal is involved in the ion bond.

The semiconductor layer includes an oxide semiconductor material.

The thin film transistor substrate further includes a first gate insulating film on the semiconductor layer, and a second gate insulating film on the first gate insulating film, in which a surface oxygen concentration of the second gate insulating film is higher than a surface oxygen concentration of the first gate insulating film.

A dipole moment is formed between the first gate insulating film and the second gate insulating film.

In accordance with a further aspect of the present disclosure, there is provided a display device including a substrate, and a plurality of pixels on the substrate, in which the pixel includes a pixel driver on the substrate, and a display element connected with the pixel driver, in which the pixel driver includes at least one thin film transistor, in which the thin film transistor includes a first buffer layer on the substrate, a second buffer layer on the first buffer layer, a semiconductor layer on the second buffer layer, and a gate electrode spaced apart from the semiconductor layer, at least a part of the gate electrode overlapping with the semiconductor layer, in which a surface oxygen concentration of the first buffer layer is higher than a surface oxygen concentration of the second buffer layer.

A dipole moment is formed between the first buffer layer and the second buffer layer.

The thin film transistor substrate further includes a first gate insulating film on the semiconductor layer, and a second gate insulating film on the first gate insulating film, in which a surface oxygen concentration of the second gate insulating film is higher than a surface oxygen concentration of the first gate insulating film.

A dipole moment is formed between the first gate insulating film and the second gate insulating film.

According to one embodiment of the present disclosure, the multi-layered buffer layer or the multi-layered gate insulating film is provided, in order to include the semiconductor layer of the oxide semiconductor material, to have the positive threshold voltage, and also to prevent the leakage current in the turning-off state.

According to another embodiment of the present disclosure, the thin film transistor capable of preventing the leakage current is provided, whereby it is unnecessary to provide an additional thin film transistor capable of preventing the leakage current. Thus, it is possible to reduce the number of thin film transistors included in the shift register, and to decrease the area of the shift register. As a result, it is possible to decrease the area of the gate driver.

According to another embodiment of the present disclosure, the display device includes the thin film transistor capable of preventing the leakage current. Accordingly, it is possible to prevent the leakage of emission caused by the leakage current, to thereby improve emission efficiency of the display device.

In addition to the effects of the present disclosure as mentioned above, additional advantages and features of the present disclosure will be clearly understood by those skilled in the art from the description of the present disclosure.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE EMBODIMENTS

Figure 1:
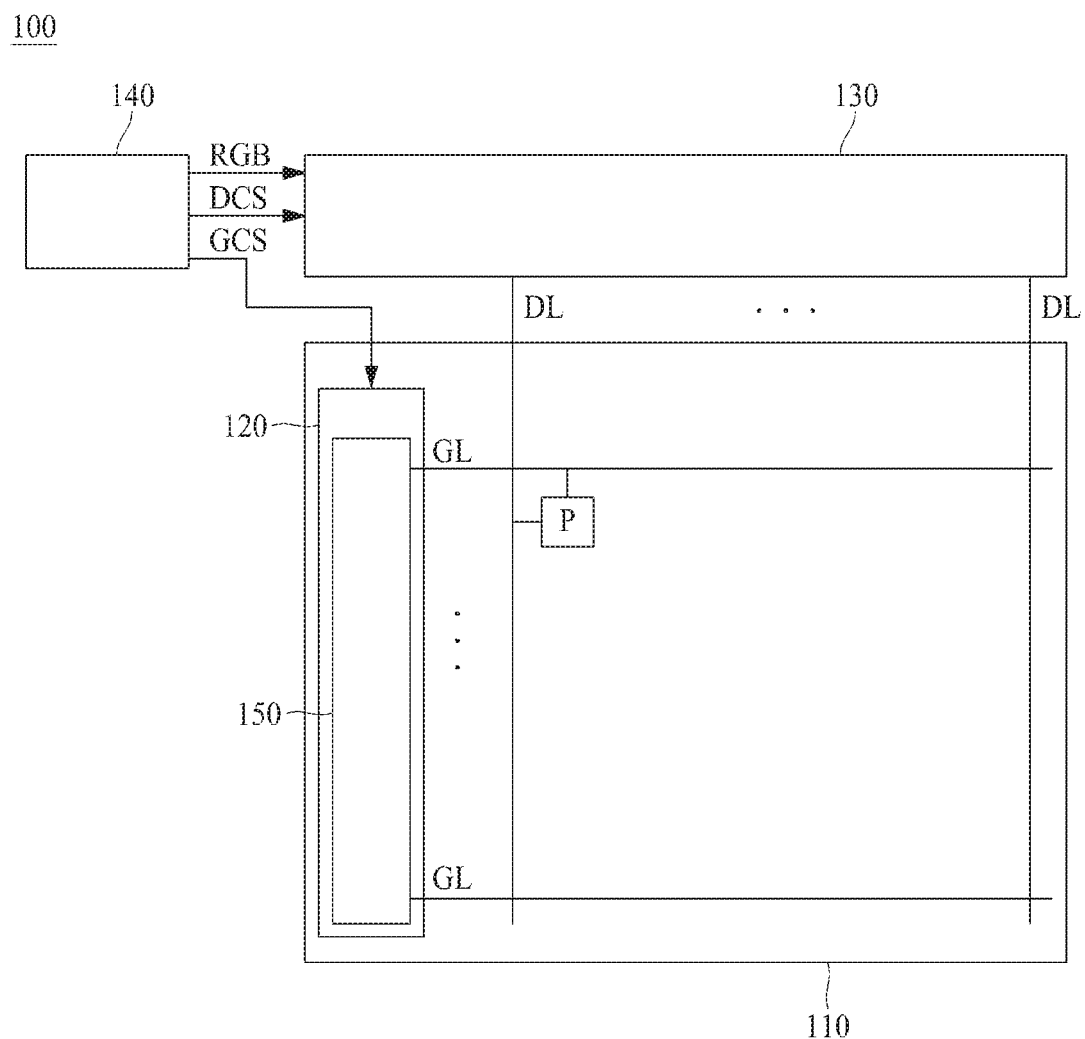
FIG. 1 is a schematic view illustrating a display device according to an embodiment of the present disclosure.

Advantages and features of the present disclosure, and implementation methods thereof will be clarified through the following embodiments, described with reference to the accompanying drawings. The present disclosure may, however, be embodied in different forms and should not be construed as being limited to the embodiments set forth herein. Rather, these embodiments are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing embodiments of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the situation in which "comprise," "have," and "include" described in the present specification are used, another part may also be present unless "only" is used. The terms in a singular form may include plural forms unless noted to the contrary.

In construing an element, the element is construed as including an error region although there is no explicit description thereof.

In describing a positional relationship, for example, when the positional order is described as "on," "above," "below," "beneath," and "next," the situation of no contact therebetween may be included, unless "just" or "direct" is used. If it is mentioned that a first element is positioned "on" a second element, it does not necessarily mean that the first element is positioned above the second element in the figure. The upper part and the lower part of an object concerned may be changed depending on the orientation of the object. Consequently, the situation in which a first element is positioned "on" a second element includes the situation in which the first element is positioned "below" the second element as well as the situation in which the first element is positioned "above" the second element in the figure or in an actual configuration.

In describing a temporal relationship, for example, when the temporal order is described as "after," "subsequent," "next," and "before," a situation which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The terms "first horizontal axis direction," "second horizontal axis direction," and "vertical axis direction" should not be interpreted only based on a geometrical relationship in which the respective directions are perpendicular to each other, and may be meant as directions having wider directivities within the range within which the components of the present disclosure can operate functionally.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

In the drawings, the same or similar elements are denoted by the same reference numerals even though they are depicted in different drawings.

In the embodiments of the present disclosure, a source electrode and a drain electrode are distinguished from each other, for convenience of explanation. However, the source electrode and the drain electrode are used interchangeably. Thus, the source electrode may be the drain electrode, and the drain electrode may be the source electrode. Also, the source electrode in any one embodiment of the present disclosure may be the drain electrode in another embodiment of the present disclosure, and the drain electrode in any one embodiment of the present disclosure may be the source electrode in another embodiment of the present disclosure.

In one or more embodiments of the present disclosure, for convenience of explanation, a source region is distinguished from a source electrode, and a drain region is distinguished from a drain electrode. However, embodiments of the present disclosure are not limited to this structure. For example, a source region may be a source electrode, and a drain region may be a drain electrode. Also, a source region may be a drain electrode, and a drain region may be a source electrode.

FIG. 1 is a schematic view illustrating a display device 100 according to one embodiment of the present disclosure.

As shown in FIG. 1, the display device 100 according to one embodiment of the present disclosure includes a display panel 110, a gate driver 120, a data driver 130, and a controller 140.

The display panel 110 includes gate lines (GL) and data lines (DL), and a pixel (P) which is arranged at a crossing portion of the gate line (GL) and the data line (DL).

The gate driver 120 includes a shift register 150. The shift register 150 sequentially supplies a scan pulse to the gate lines (GL) of the display panel 110.

The data driver 130 supplies a data voltage to the data lines (DL) of the display panel 110.

The controller 140 controls the gate driver 120 and the data driver 130.

The pixel (P) includes a display element, and at least one thin film transistor for driving the display element. An image is displayed on the display panel 110 by driving the pixel (P).

The controller 140 outputs a gate control signal (GCS) for controlling the gate driver 120, and a data control signal (DCS) for controlling the data driver 130 by the use of vertically/horizontally synchronized signal (V, H) and clock signal (CLK) supplied from an external system.

The gate control signal (GCS) includes a gate start pulse (GSP), a gate shift clock (GSC), a gate output enable signal (GOE), a start signal (Vst), and a gate clock (GCLK). Also, various control signals for controlling the shift register 150 can be included in the gate control signal (GCS).

The data control signal (DCS) includes a source start pulse (SSP), a source shift clock signal (SSC), a source output enable signal (SOE), and a polarity control signal (POL).

The controller 140 samples input video data, which is provided from the external system, and then re-aligns the sampled video data, and supplies the re-aligned digital video data (RGB) to the data driver 130. Also, the controller 140 generates the gate control signal (GCS) for controlling the gate driver 120, and the data control signal (DCS) for controlling the data driver 130 by the use of clock signal (CLK), horizontally synchronized signal (Hsync), vertically synchronized signal (Vsync) (these signals are briefly referred to as "timing signals"), and data enable signal (DE) supplied from the external system, and then respectively transmits the gate control signal (GCS) and the data control signal (DCS) to the gate driver 120 and the data driver 130.

The data driver 130 converts the video data (RGB) provided from the controller 140 into an analog data voltage, and supplies the analog data voltage of 1 horizontal line to the data lines (DL) every 1 horizontal period for supplying the gate pulse to the gate line (GL).

According to one embodiment of the present disclosure, the gate driver 120 is provided in the display panel 110. A structure where the gate driver 120 is directly provided in the display panel 110 is referred to as a Gate In Panel (GIP) structure. In this situation, the gate control signal (GCS) for controlling the gate driver 120 can include the start signal (Vst) and the gate clock (GCLK).

The gate driver 120 sequentially supplies the gate pulse (GP) to the gate lines (GL) of the display panel 110 in response to the gate control signal (GCS) provided from the controller 140. Accordingly, the thin film transistor formed in each pixel (P) of the corresponding gate line (GL) supplied with the gate pulse (GP) is turned-on so that an image can be provided to each pixel (P).

The gate driver 120 includes the shift register 150, in which the shift register 150 generates and supplies the gate pulse (GP).

In detail, the shift register 150 sequentially supplies the gate pulse (GP) to the gate lines (GL) for 1 frame by the use of start signal (Vst) and gate clock (GCLK) transmitted from the controller 140. Herein, '1 frame' indicates the period in which one image is output through the display panel 110.

The gate pulse (GP) has a turn-on voltage capable of turning on a switching element (thin film transistor) formed in the pixel (P).

Also, the shift register 150 supplies a gate-off signal capable of turning off the switching element to the gate line (GL) for the remaining period of 1 frame in which the gate pulse (GP) is not supplied. Hereinafter, the gate pulse (GP) and the gate-off signal (Goff) are totally referred to as scan signals (SS).

Figure 2:
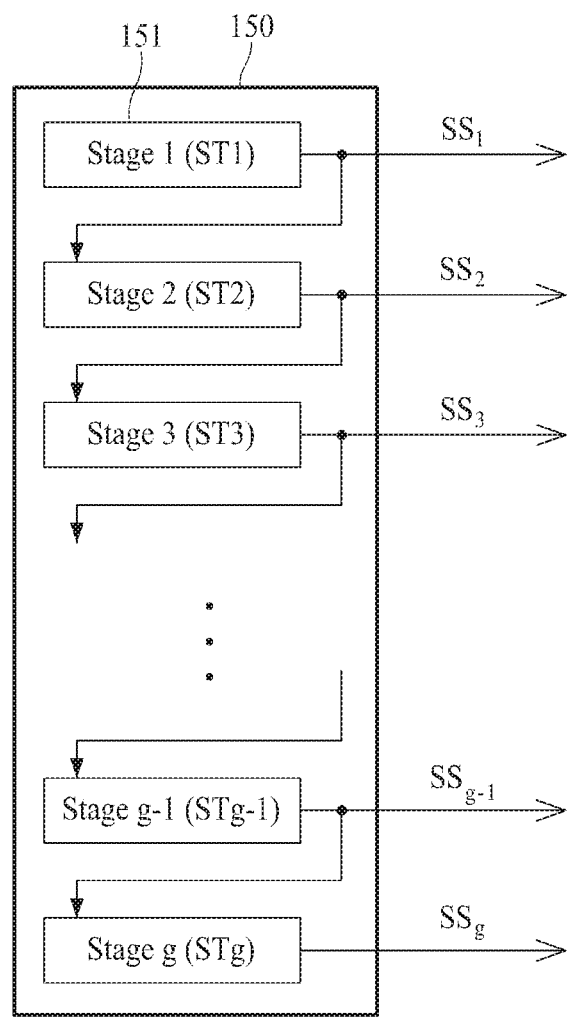
FIG. 2 is a schematic view illustrating a shift register according to embodiment of the present disclosure.
Figure 3:
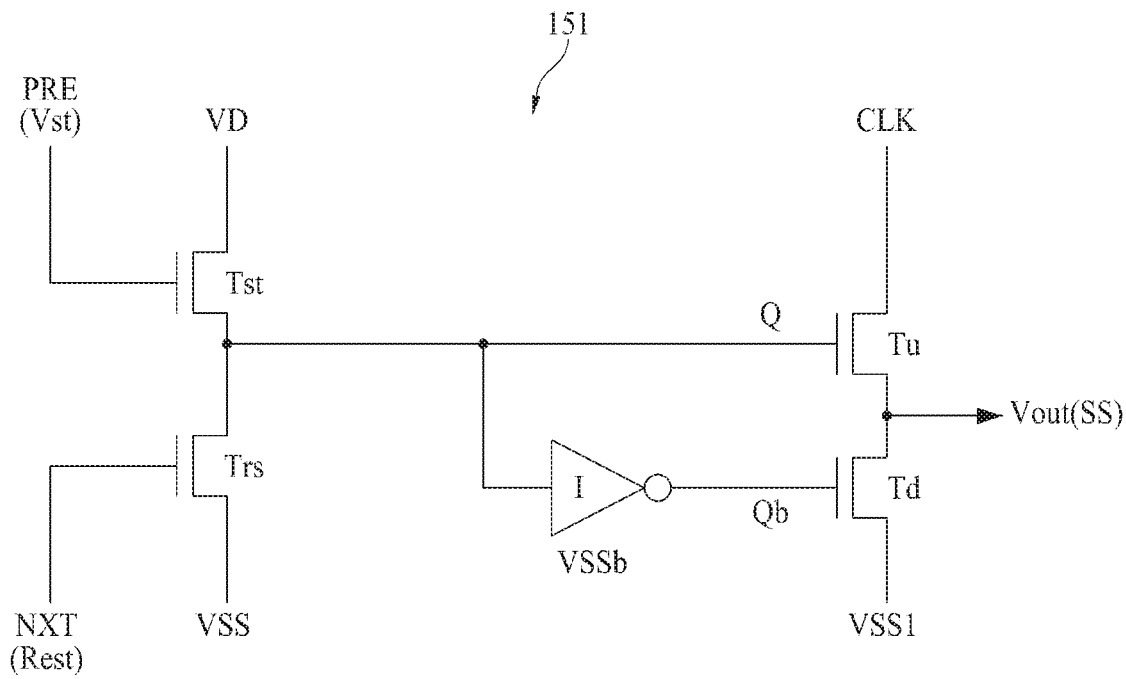
FIG. 3 is a circuit diagram illustrating a stage included in the shift register of FIG. 2 according to embodiment of the present disclosure.

FIG. 2 is a schematic view illustrating the shift register 150. FIG. 3 is a circuit diagram illustrating the stage 151 included in the shift register 150 of FIG. 2.

The shift register 150 according to one embodiment of the present disclosure includes 'g' stages 151 (ST1 to STg), as shown in FIG. 2.

The shift register 150 transmits one scan signal (SS) to pixels (P) connected with one gate line (GL) through one gate line (GL). Each of the stages 151 is connected with one gate line (GL).

Thus, if 'g' gate lines (GL) are provided in the display panel 110, the shift register 150 includes 'g' stages (ST1 to STg) 151, and generates 'g' scan signals (SS1 to SSg).

According to one embodiment of the present disclosure, the thin film transistor of the stage 151 is formed of an oxide semiconductor. Generally, the thin film transistor of the oxide semiconductor is an N-type transistor. Thus, for convenience of explanation, one embodiment of the present disclosure in which the transistors included in the stage are formed of N-type transistors will be described.

Generally, each stage 151 outputs the gate pulse (GP) once for 1 frame, and the gate pulse (GP) is sequentially output from each stage 151.

Each of the stages 151 which sequentially output the scan signal (SS), as shown in FIG. 3, includes a pull-up transistor (Tu), a pull-down transistor (Td), a start transistor (Tst), a reset transistor (Trs), and an inverter (I).

The pull-up transistor (Tu) is turned-on or turned-off in accordance with a logic state of Q node. If the pull-up transistor (Tu) is turned-on, the clock signal (CLK) is supplied to the pull-up transistor (Tu), and the pull-up transistor (Tu) outputs the gate pulse (GP).

The pull-down transistor (Td) is connected between the pull-up transistor (Tu) and a turn-off voltage (VSS1). When the pull-up transistor (Tu) is turned-on, the pull-down transistor (Td) is turned-off. When the pull-up transistor (Tu) is turned-off, the pull-down transistor (Td) is turned-on, whereby the gate-off signal (Goff) is output.

An output signal (Vout) of the stage 151 includes the gate pulse (GP) and the gate-off signal (Goff). The gate pulse (GP) has a high level voltage, and the gate-off signal (Goff) has a low level voltage.

The start transistor (Tst) charges the Q node with a high level voltage (VD) in response to a prior output (PRE) from a prior stage. When the corresponding stage 151 is the first stage (ST1), the start pulse (Vst) instead of the prior output (Pre) is supplied thereto.

The reset transistor (Trs) discharges a low potential voltage (VSS) corresponding to a reset voltage into the Q node in response to a next output (NXT) of the next stage. When the corresponding stage 151 is the last stage (STg), a reset pulse (Rest) instead of the next output (NXT) is supplied thereto.

Generally, a control signal which is provided to a gate terminal of the reset transistor (Trs) maintains a low state when the Q node is a high state.

If the high-level signal is provided to the Q node, the pull-up transistor (Tu) is turned-on so that the pull-up transistor (Tu) outputs the gate pulse (GP). In this situation, when the reset transistor (Trs) is turned-off, the low potential voltage (VSS) is not supplied to the reset transistor (Trs).

When the gate pulse (GP) is output, the control signal of the high level is provided to the gate terminal of the reset transistor (Trs), whereby the reset transistor (Trs) is turned-on, and the pull-up transistor (Tu) is turned-off. As a result, the gate pulse (GP) is not output through the pull-up transistor (Tu).

When the gate pulse (GP) is not generated, the inverter (I) transmits Qb node control signal for generating the gate-off signal (Goff) to the pull-down transistor (Td) through the Qb node.

In detail, the data voltage is output to the data lines (DL) every 1 horizontal period by the turn-on voltage capable of turning on the switching element of each pixel (P) connected with the gate line (GL), and the gate-off signal (Goff) for maintaining the turn-off state of the switching element is provided to the gate line (GL) for the remaining period of 1 frame except 1 horizontal period.

To this end, the inverter (I) transmits the Qb node control signal to the pull-down transistor (Td) through the Qb node for the remaining period of 1 frame except 1 horizontal period.

The pull-down transistor (Td) is turned-on by the Qb node control signal supplied from the inverter (I), whereby the gate-off signal (Goff) is output to the gate line (GL).

If a leakage current is generated in the transistors (Tst, Trs, Tu, Td) included in the stage 151, the gate pulse (GP) can be not generated appropriately, whereby it may cause lowering of reliability in the display device 100.

For example, when the Q node control signal for outputting the gate pulse (GP) is transmitted to the pull-up transistor (Tu), the reset transistor (Trs) prevents the Q node control signal from leaking to the external. On the assumption that the leakage current is generated in the reset transistor (Trs), if the Q node control signal is supplied to the pull-up transistor (Tu), the Q node control signal may leak.

If the shift register 150 is formed only with the N-type transistor, the voltage of some node may be not lowered lower than a discharging voltage (VSS). Thus, even though the transistor is logically turned-off, a gate-to-source voltage is larger than 0, whereby the leakage current flows through the transistor. Especially, if a threshold voltage of the transistor is a negative value, the leakage current becomes a serious concern, whereby it may cause an abnormal operation in the circuit.

In order to prevent the leakage current in the transistor, the shift register 150 of the gate driver 120 according to one embodiment of the present disclosure uses the thin film transistor capable of preventing the leakage current.

In detail, the display device 100 according to one embodiment of the present disclosure includes a substrate, the shift register 150 on the substrate 110, and the pixel (P) connected with the shift register 150. The shift register 150 includes the stage 151 connected with the pixel (P) through the gate line (GL), and the stage 151 includes at least one thin film transistor (TFT). The thin film transistor (TFT) includes a first buffer layer 231 on the substrate 110, a second buffer layer 232 on the first buffer layer 231, a semiconductor layer 240 on the second buffer layer 232, and a gate electrode 260 spaced apart from the semiconductor layer 240 and at least a part of the gate electrode 260 overlaps with the semiconductor layer 240 (e.g., see FIG. 4). A surface oxygen concentration in the first buffer layer 231 is higher than a surface oxygen concentration in the second buffer layer 232.

According to one embodiment of the present disclosure, a dipole moment is formed between the first buffer layer 231 and the second buffer layer 232. The first buffer layer 231 includes an ion bond in which a metal is involved, and the second buffer layer 232 includes a covalent bond. The semiconductor layer 240 includes an oxide semiconductor material.

Figure 7:
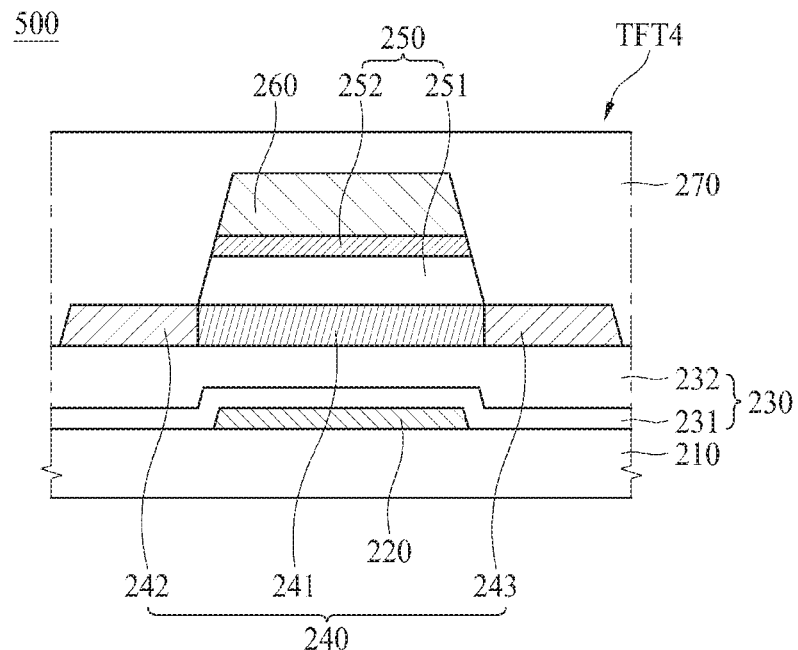
FIG. 7 is a cross sectional view illustrating a thin film transistor substrate according to another embodiment of the present disclosure.
Figure 8:
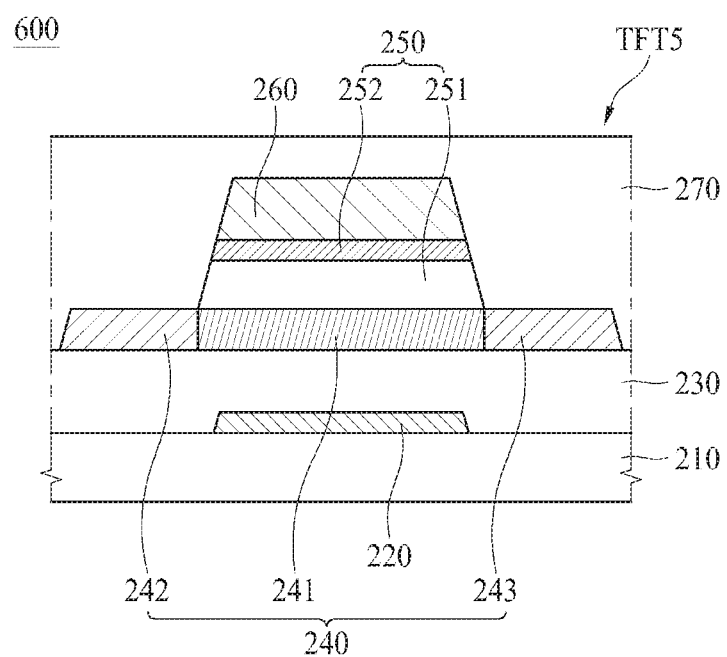
FIG. 8 is a cross sectional view illustrating a thin film transistor substrate according to another embodiment of the present disclosure.

Also, the thin film transistor (TFT) includes a first gate insulating film 251 on the semiconductor layer 240, and a second gate insulating film 252 on the first gate insulating film 251 (e.g., see FIGS. 7 and 8). A surface oxygen concentration in the second gate insulating film 252 is higher than a surface oxygen concentration in the first gate insulating film 251. Between the first gate insulating film 251 and the second gate insulating film 252, a dipole moment is formed in-between.

Hereinafter, a thin film transistor (TFT) capable of preventing a leakage current, and a thin film transistor substrate including the same will be described in detail with reference to the accompanying drawings.

Figure 4:
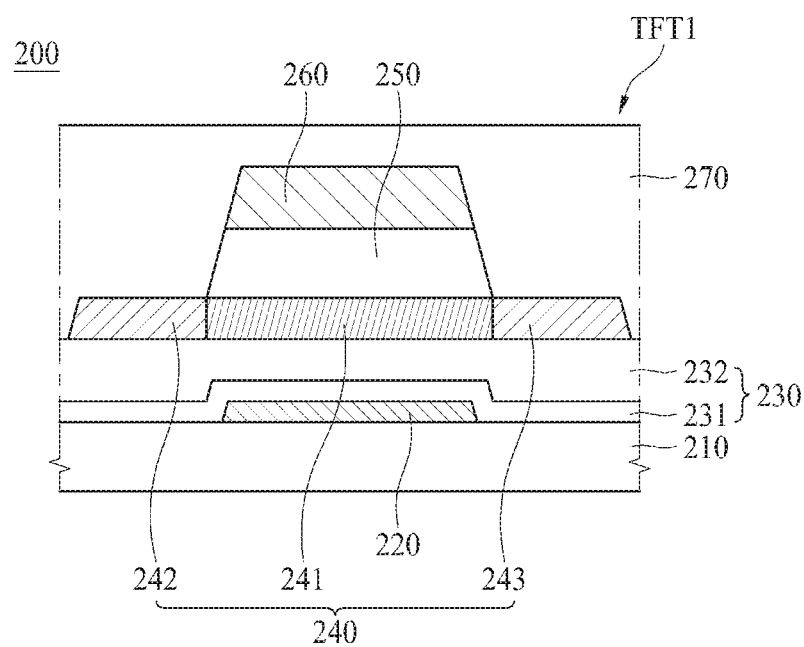
FIG. 4 is a cross sectional view illustrating a thin film transistor substrate according to another embodiment of the present disclosure.

FIG. 4 is a cross sectional view illustrating a thin film transistor substrate 200 according to another embodiment of the present disclosure. The thin film transistor substrate 200 includes a thin film transistor (TFT1). The thin film transistor (TFT1) of FIG. 4 can be formed of the thin film transistor (TFT) of the shift register 150 provided in the display device 100 according to one embodiment of the present disclosure.

The thin film transistor substrate 200 according to another embodiment of the present disclosure includes a substrate 210, a first buffer layer 231 on the substrate 210, a second buffer layer 232 on the first buffer layer 231, a semiconductor layer 240 on the second buffer layer 232, and a gate electrode 260 spaced apart from the semiconductor layer 240 and at least a part of the gate electrode 260 overlaps with the semiconductor layer 240. A surface oxygen concentration in the first buffer layer 231 is higher than a surface oxygen concentration in the second buffer layer 232.

The combination of the first buffer layer 231 and the second buffer layer 232 are referred to as a buffer layer 230. Also, referring to FIG. 4, the thin film transistor substrate 200 includes a gate insulating film 250 between the semiconductor layer 240 and the gate electrode 260.

According to another embodiment of the present disclosure, the remaining portions except the substrate 210 of the thin film transistor substrate 200 can be referred to as a thin film transistor (TFT1). Thus, according to another embodiment of the present disclosure, the thin film transistor (TFT1) includes the buffer layer 230, the semiconductor layer 240, and the gate electrode 260. Also, the thin film transistor (TFT1) can further include the gate insulating film 250, a source electrode 280, and a drain electrode 290 (See FIG. 5).

Hereinafter, a detailed structure for each element of the thin film transistor substrate 200 will be described as follows.

The substrate 210 can be formed of glass or plastic. The substrate 210 can be formed of plastic having flexibility, for example, polyimide (PI). If using the substrate 210 of polyimide (PI), a high-temperature deposition process is carried out on the substrate 210. In this reason, the substrate 210 is formed of heat-resistant polyimide capable of enduring a high temperature.

A light shielding layer 220 can be disposed on the substrate 210. The light shielding layer 220 is overlapped with the semiconductor layer 240. The light shielding layer 220 blocks light being incident on the semiconductor layer 240, to thereby protect the semiconductor layer 240.

The buffer layer 230 is disposed on the substrate 210. The buffer layer 230 can be disposed on the light shielding layer 220 of the substrate 210. The buffer layer 230 protects the semiconductor layer 240, and planarizes an upper surface of the substrate 210 by the planarizing properties.

The buffer layer 230 includes the first buffer layer 231 on the substrate 210, and the second buffer layer 232 on the first buffer layer 231. According to another embodiment of the present disclosure, the surface oxygen concentration in the first buffer layer 231 is higher than the surface oxygen concentration in the second buffer layer 232. In detail, in the interface between the first buffer layer 231 and the second buffer layer 232, the surface oxygen concentration of the first buffer layer 231 is higher than the surface oxygen concentration of the second buffer layer 232.

Due to the difference between the surface oxygen concentrations, an oxygen transfer (oxygen ion) is generated between the first buffer layer 231 and the second buffer layer 232. In detail, some of oxygen ($O^{2-}$) included in the first buffer layer 231 having a high oxygen concentration can be transferred to the second buffer layer 232 having a low oxygen concentration. As a result, a positive (+) polarity can be generated in a surface of the first buffer layer 231, and a negative (−) polarity can be generated in a surface of the second buffer layer 232. Thus, the dipole moment ($\vec{p}$) can be formed between the first buffer layer 231 and the second buffer layer 232 (See FIG. 10).

According to another embodiment of the present disclosure, the dipole moment ($\vec{p}$) can be formed in a direction being far away from the semiconductor layer 240.

By the dipole moment ($\vec{p}$) a Fermi Level ($E_f$) of the semiconductor layer 240 can be changed.

Figure 9A:
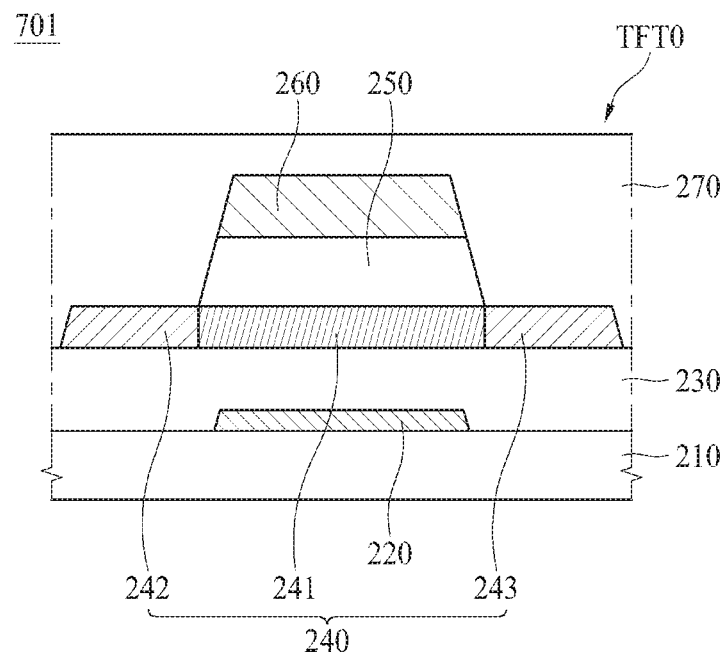
FIG. 9A is a cross sectional view illustrating a thin film transistor substrate according to a comparative example, according to embodiment of the present disclosure.
Figure 9B:
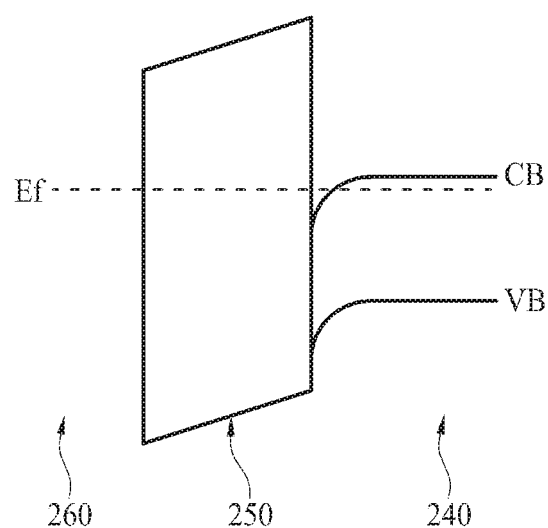
FIG. 9B is an energy band diagram of a thin film transistor according to a comparative example, according to embodiment of the present disclosure.

In more detail, the semiconductor layer 240 of the oxide semiconductor material has a Fermi level (Ef) which is close to a conduction band (CB), generally (See FIG. 9B). As a result, the thin film transistor (TFT0) including the semiconductor layer 240 of the oxide semiconductor material has a negative (−) threshold voltage. Thus, even though the thin film transistor (TFT0) is turned-off, a leakage current may be generated (See FIG. 9C).

Figure 12:
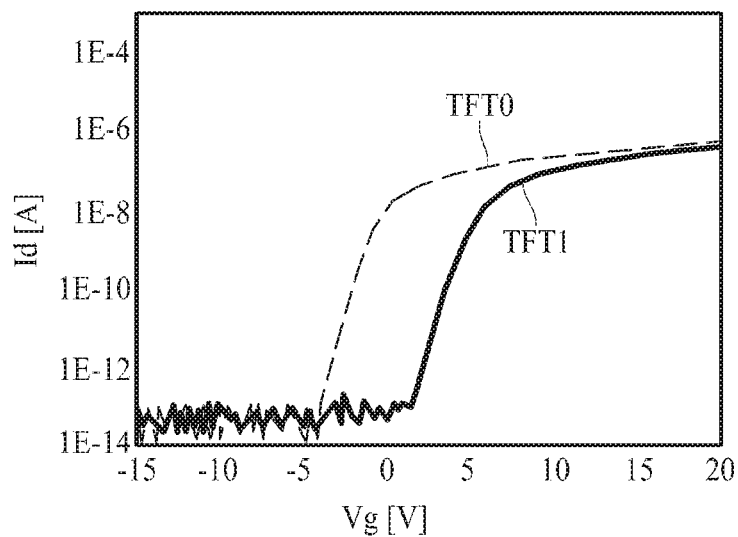
FIG. 12 is a graph showing a drain current in accordance with a gate voltage in a thin film transistor according to a comparative example and a thin film transistor according to one embodiment of the present disclosure.

In addition, according to another embodiment of the present disclosure, if the dipole moment ($\vec{p}$) is formed between the first buffer layer 231 and the second buffer layer 232, the Fermi level (Ef) of the semiconductor layer 240 formed of the oxide semiconductor material is transferred to a valence band (VB), and the threshold voltage of the thin film transistor (TFT1) is transferred to the positive direction (See FIG. 12). As a result, it is possible to prevent a leakage current in the thin film transistor (TFT1). In other words, the surface oxygen concentration levels of various layers near the semiconductor layer 240 can be adjusted, in order to create a dipole moment that shifts the threshold voltage of the thin film transistor to a more desirable turn on voltage (e.g., a much safer threshold voltage level), so that the thin film transistor does not leak current and does not get accidentally get turned on at inopportune moments.

According to another embodiment of the present disclosure, the first buffer layer 231 includes the ion bond in which a metal is involved, and the second buffer layer 232 includes the covalent bond. The surface oxygen concentration in the first buffer layer 231 having the ion bond can be higher than the surface oxygen concentration in the second buffer layer 232 having the covalent bond. Accordingly, due to the oxygen ($O^{2-}$) transfer in the interface between the first buffer layer 231 and the second buffer layer 232, the positive (+) polarity is generated in the surface of the first buffer layer 231, and the negative (−) polarity is generated in the surface of the second buffer layer 232, whereby the dipole moment ($\vec{p}$) can be formed between the first buffer layer 231 and the second buffer layer 232.

According to another embodiment of the present disclosure, the first buffer layer 231 can include at least one among aluminum oxide ($Al_2O_3$), titanium oxide ($TiO_2$), hafnium oxide ($HfO_2$), tantalum oxide ($Ta_2O_5$), zirconium oxide ($ZrO_2$), magnesium oxide (MgO), and scandium oxide ($Sc_2O_3$), and the second buffer layer 232 can include silicon oxide ($SiO_2$).

According to another embodiment of the present disclosure, the first buffer layer 231 can include silicon oxide ($SiO_2$), and the second buffer layer 232 can include at least one among strontium oxide (SrO), lanthanum oxide ($La_2O$), and yttrium oxide ($Y_2O_3$).

The semiconductor layer 240 is disposed on the buffer layer 230. Referring to FIG. 4, the semiconductor layer 240 is disposed on the second buffer layer 232.

According to another embodiment of the present disclosure, the semiconductor layer 240 includes the oxide semiconductor material. For example, the semiconductor layer 240 can include at least one among IZO(InZnO)-based oxide semiconductor, IGO(InGaO)-based oxide semiconductor, ITO(InSnO)-based oxide semiconductor, IGZO(InGaZnO)-based oxide semiconductor, IGZTO(InGaZnSnO)-based oxide semiconductor, GZTO(GaZnSnO)-based oxide semiconductor, GZO(GaZnO)-based oxide semiconductor, and ITZO(InSnZnO)-based oxide semiconductor. However, one embodiment of the present disclosure is not limited to the above. The semiconductor layer 240 can be formed of other oxide semiconductor materials generally known to those in the art.

The semiconductor layer 240 has a channel portion 241 and conducting portions 242 and 243. Any one of the conducting portions 242 and 243 corresponds to a source area 242, and the other corresponds to a drain area 243. According to another embodiment of the present disclosure, the source area 242 functions as a source electrode, and the drain area 243 functions as a drain electrode. Thus, the source area 242 can be referred to as the source electrode, and the drain area 243 can be referred to as the drain electrode. However, another embodiment of the present disclosure is not limited to the above. The thin film transistor substrate 200 can further include an additional source electrode 280 connected with the source area 242, and an additional drain electrode 290 connected with the drain area 243 (See FIG. 5).

Referring to FIG. 4, the gate insulating film 250 is disposed on the semiconductor layer 240. The gate insulating film 250 can include at least one among silicon oxide, silicon nitride, and metal oxide. The gate insulating film 250 can be formed in a single-layered structure or a multi-layered structure. The gate insulating film 250 protects the semiconductor layer 240.

The gate electrode 260 is disposed on the gate insulating film 250. The gate electrode 260 is overlapped with at least channel portion 241 of the semiconductor layer 240.

The gate electrode 260 can include at least one among aluminum-based metal such as aluminum (Al) or aluminum alloy, argentums-based metal such as argentums (Ag) or argentums alloy, copper-based metal such as copper (Cu) or copper alloy, molybdenum-based metal such as molybdenum (Mo) or molybdenum alloy, chrome (Cr), tantalum (Ta), neodymium (Nd), and titanium (Ti). The gate electrode 260 can be formed in a multi-layered structure including at least two conductive films having the different physical properties.

An insulating interlayer 270 is disposed on the gate electrode 260. The insulating interlayer 270 is formed of an insulating material. The insulating interlayer 270 can be formed of an organic material, an inorganic material, or a deposition structure including both organic and inorganic materials.

Figure 5:
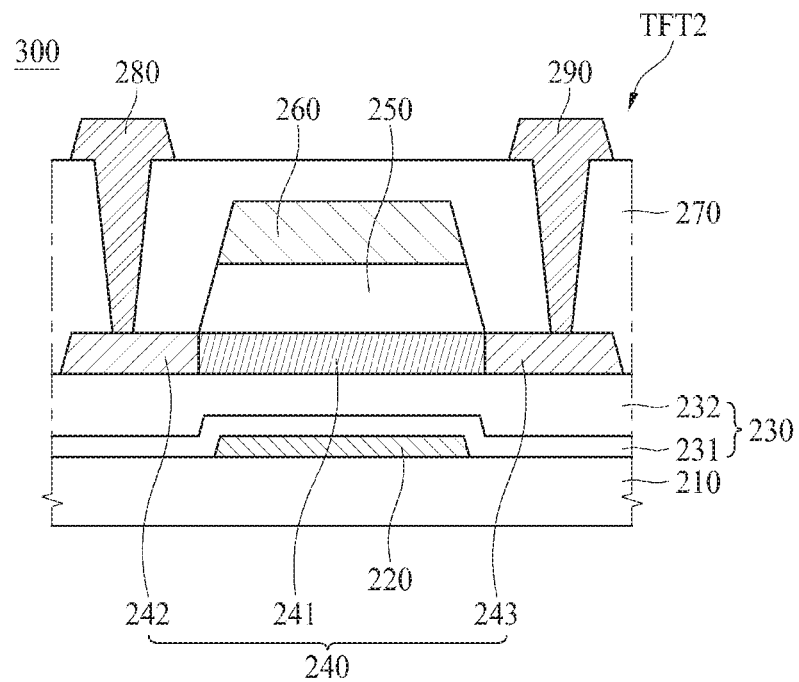
FIG. 5 is a cross sectional view illustrating a thin film transistor substrate according to another embodiment of the present disclosure.

FIG. 5 is a cross sectional view illustrating a thin film transistor substrate 300 according to another embodiment of the present disclosure. Hereinafter, in order to avoid an unnecessary repetition, a detailed description for the same parts will be omitted.

In comparison to the thin film transistor substrate 200 of FIG. 4, the thin film transistor substrate 300 of FIG. 5 further includes a source electrode 280 and a drain electrode 290 on an insulating interlayer 270.

Referring to FIG. 5, the source electrode 280 and the drain electrode 290 are respectively connected with a source area 242 and a drain area 243 of a semiconductor layer 240 through a contact hole provided in the insulating interlayer 270. The source electrode 280 is connected with a channel portion 241 of the semiconductor layer 240 through the source area 242, and the drain electrode 290 is connected with the channel portion 241 of the semiconductor layer 240 through the drain area 243.

The source electrode 280 and the drain electrode 290 can include at least one among molybdenum (Mo), aluminum (Al), chrome (Cr), aurum (Au), titanium (Ti), nickel (Ni), neodymium (Nd), copper (Cu), and their alloys. Each of the source electrode 280 and the drain electrode 290 can be formed in a single-layered structure of any one material selected among the above molybdenum (Mo), aluminum (Al), chrome (Cr), aurum (Au), titanium (Ti), nickel (Ni), neodymium (Nd), copper (Cu), and their alloys, or can be formed in a multi-layered structure of two or more materials selected among the above molybdenum (Mo), aluminum (Al), chrome (Cr), aurum (Au), titanium (Ti), nickel (Ni), neodymium (Nd), copper (Cu), and their alloys.

A thin film transistor (TFT2) provided in the thin film transistor substrate 300 of FIG. 5 can be formed of the thin film transistor (TFT) of the shift register 150 provided in the display device 100 according to one embodiment of the present disclosure.

Figure 6:
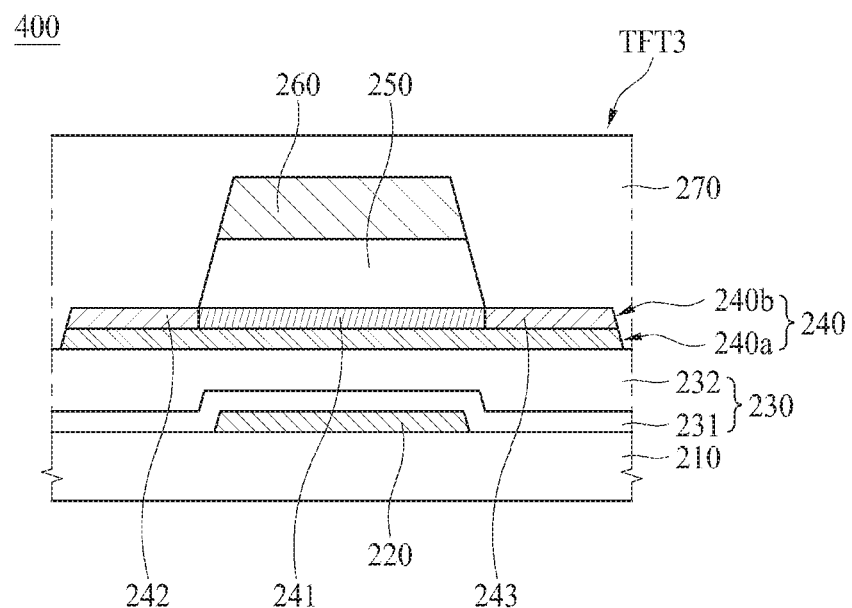
FIG. 6 is a cross sectional view illustrating a thin film transistor substrate according to another embodiment of the present disclosure.

FIG. 6 is a cross sectional view illustrating a thin film transistor substrate 400 according to another embodiment of the present disclosure.

In comparison to the thin film transistor substrate 200 of FIG. 4, the thin film transistor substrate 400 of FIG. 6 has a semiconductor layer 240 formed in a multi-layered structure. In detail, the semiconductor layer 240 of the thin film transistor substrate 400 shown in FIG. 6 includes a first semiconductor layer 240a on a buffer layer 230, and a second semiconductor layer 240b on the first semiconductor layer 240a. The first semiconductor layer 240a and the second semiconductor layer 240b can include the same semiconductor material, or can include the different semiconductor materials.

The first semiconductor layer 240a supports the second semiconductor layer 240b. Thus, the first semiconductor layer 240a is referred to as a supporting layer. A channel portion 241 is formed on the second semiconductor layer 240b. Thus, the second semiconductor layer 240b is referred to as a channel layer. However, the embodiment of the present disclosure is not limited to the above. The channel portion 241 can be formed in the first semiconductor layer 240a.

The first semiconductor layer 240a and the second semiconductor layer 240b can be formed by a deposition process. The first semiconductor layer 240a and the second semiconductor layer 240b can be formed by a consecutive process. The semiconductor layer 240 can be formed in a hi-layer structure including the first semiconductor layer 240a and the second semiconductor layer 240b.

A thin film transistor (TFT3) provided in the thin film transistor substrate 400 of FIG. 6 can be formed of the thin film transistor (TFT) of the shift register 150 provided in the display device 100 according to one embodiment of the present disclosure.

FIG. 7 is a cross sectional view illustrating a thin film transistor substrate 500 according to another embodiment of the present disclosure.

In comparison to the thin film transistor substrate 200 of FIG. 4, the thin film transistor substrate 500 of FIG. 7 includes a gate insulating film 250 formed in a multi-layered structure.

In detail, the thin film transistor substrate 500 of FIG. 7 includes a first gate insulating film 251 on a semiconductor layer 240, and a second gate insulating film 252 on the first gate insulating film 251 in the interface between the first gate insulating film 251 and the second gate insulating film 252, a surface oxygen concentration in the second gate insulating film 252 is higher than a surface oxygen concentration in the first gate insulating film 251.

Due to the difference of surface oxygen concentration, an oxygen (O2—) is transferred from the second gate insulating film 252 having a high oxygen concentration to the first gate insulating film 251 having a low oxygen concentration, whereby a positive (+) polarity can be generated in a surface of the second gate insulating film 252, and a negative (−) polarity can be generated in a surface of the first gate insulating film 251. Thus, a dipole moment ($\vec{p}$) can be formed between the first gate insulating film 251 and the second gate insulating film 252. The dipole moment ($\vec{p}$) can be formed in a direction being far away from the semiconductor layer 240.

According as the dipole moment ($\vec{p}$) can be formed between the first gate insulating film 251 and the second gate insulating film 252, a Fermi level ($E_f$) in the semiconductor layer 240 of the oxide semiconductor material is transferred to a valence band (VB), and a threshold voltage of a thin film transistor (TFT4) is transferred to a positive direction (See FIG. 12). As a result, it is possible to prevent a leakage current in the thin film transistor (TFT4).

The first gate insulating film 251 includes a covalent bond, and the second gate insulating film 252 includes an ion bond in which a metal is involved. A surface oxygen concentration in the second gate insulating film 252 having the ion bond is higher than a surface oxygen concentration in the first gate insulating film 251 having the covalent bond. Accordingly, the dipole moment ($\vec{p}$) can be formed between the first gate insulating film 251 and the second gate insulating film 252.

According to another embodiment of the present disclosure, the first gate insulating film 251 can include silicon oxide ($SiO_2$), and the second gate insulating film 252 can include at least one among aluminum oxide ($Al_2O_3$), titanium oxide ($TiO_2$), hafnium oxide ($HfO_2$), tantalum oxide ($Ta_2O_5$), zirconium oxide ($ZrO_2$), magnesium oxide (MgO), and scandium oxide ($Sc_2O_3$).

In another way, the first gate insulating film 251 can include at least one among strontium oxide (SrO), lanthanum oxide ($La_2O$), and yttrium oxide ($Y_2O_3$), and the second gate insulating film 252 can include silicon oxide ($SiO_2$).

The thin film transistor (TFT4) provided in the thin film transistor substrate 500 of FIG. 7 can be formed of the thin film transistor (TFT) of the shift register 150 provided in the display device 100 according to one embodiment of the present disclosure.

FIG. 8 is a cross sectional view illustrating a thin film transistor substrate 600 according to another embodiment of the present disclosure.

The thin film transistor substrate 600 of 8 includes a semiconductor layer 240 on a substrate 210, a first gate insulating film 251 on the semiconductor layer 240, a second gate insulating film 252 on the first gate insulating film 251, and a gate electrode 260 on the second gate insulating film 252. Referring to FIG. 8, a buffer layer 230 can be disposed between the substrate 210 and the semiconductor layer 240, and a light shielding layer 220 can be disposed between the substrate 210 and the buffer layer 230.

The semiconductor layer 240 can include an oxide semiconductor material. Also, in the interface between the first gate insulating film 251 and the second gate insulating film 252, a surface oxygen concentration of the second gate insulating film 252 is higher than a surface oxygen concentration of the first gate insulating film 251.

Due to the difference of surface oxygen concentration, an oxygen (O2—) is transferred from the second gate insulating film 252 having a high oxygen concentration to the first gate insulating film 251 having a low oxygen concentration, whereby a positive (+) polarity can be generated in a surface of the second gate insulating film 252, and a negative (−) polarity can be generated in a surface of the first gate insulating film 251. Thus, a dipole moment ($\vec{p}$) can be formed between the first gate insulating film 251 and the second gate insulating film 252. The dipole moment ($\vec{p}$) can be formed in a direction being far away from the semiconductor layer 240.

According as the dipole moment ($\vec{p}$) can be formed between the first gate insulating film 251 and the second gate insulating film 252, a Fermi level ($E_f$) in the semiconductor layer 240 of the oxide semiconductor material is transferred to a valence band (VB), and a threshold voltage of a thin film transistor (TFT5) is transferred to a positive direction (See FIG. 12). As a result, it is possible to prevent a leakage current in the thin film transistor (TFT5).

The thin film transistor (TFT5) provided in the thin film transistor substrate 600 of FIG. 8 can be formed of the thin film transistor (TFT) of the shift register 150 provided in the display device 100 according to one embodiment of the present disclosure.

FIG. 9A is a cross sectional view illustrating a thin film transistor substrate 701 according to a comparative example, and FIG. 9B is an energy band diagram of the thin film transistor substrate 701 according to the comparative example. The thin film transistor substrate 701 according to the comparative example, as shown in FIG. 9A, has a single-layered buffer layer 230, and a single-layered gate insulating film 250. In situation of the thin film transistor substrate 701 shown in FIG. 9A, a semiconductor layer 240 is formed of an oxide semiconductor material, and a dipole moment ($\vec{p}$) is not formed between the gate insulating film 250 and the buffer layer 230 adjacent to the semiconductor layer 240.

Referring to FIG. 9B, the semiconductor layer 240 of the thin film transistor substrate 701 according to the comparative example is formed of the oxide semiconductor material, whereby it has a level (Ef) close to a conduction band (CB). A thin film transistor (TFT0) of the thin film transistor substrate 701 according to the comparative example, which includes the semiconductor layer 240 having the Fermi level (Ef) close to the conduction band (CB), has a negative (−) threshold voltage.

Figure 9C:
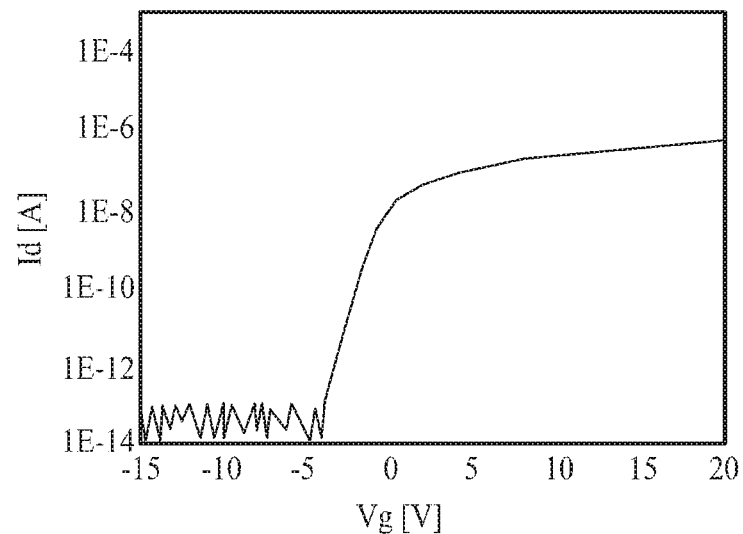
FIG. 9C is a graph showing a drain current in accordance with a gate voltage in a thin film transistor according to a comparative example, according to embodiment of the present disclosure.

FIG. 9C is a graph showing a drain current in accordance with a gate voltage in the thin film transistor according to the comparative example. Referring to FIG. 9C, the thin film transistor (TFT0) of the thin film transistor substrate 701 according to the comparative example has the negative (−) threshold voltage. Even though the thin film transistor (TFT0) is turned-off, a leakage current can occur.

If the thin film transistor (TFT0) having the leakage current is used for the thin film transistor of the shift register 150, an additional transistor for preventing the leakage current has to be disposed.

Figure 9D:
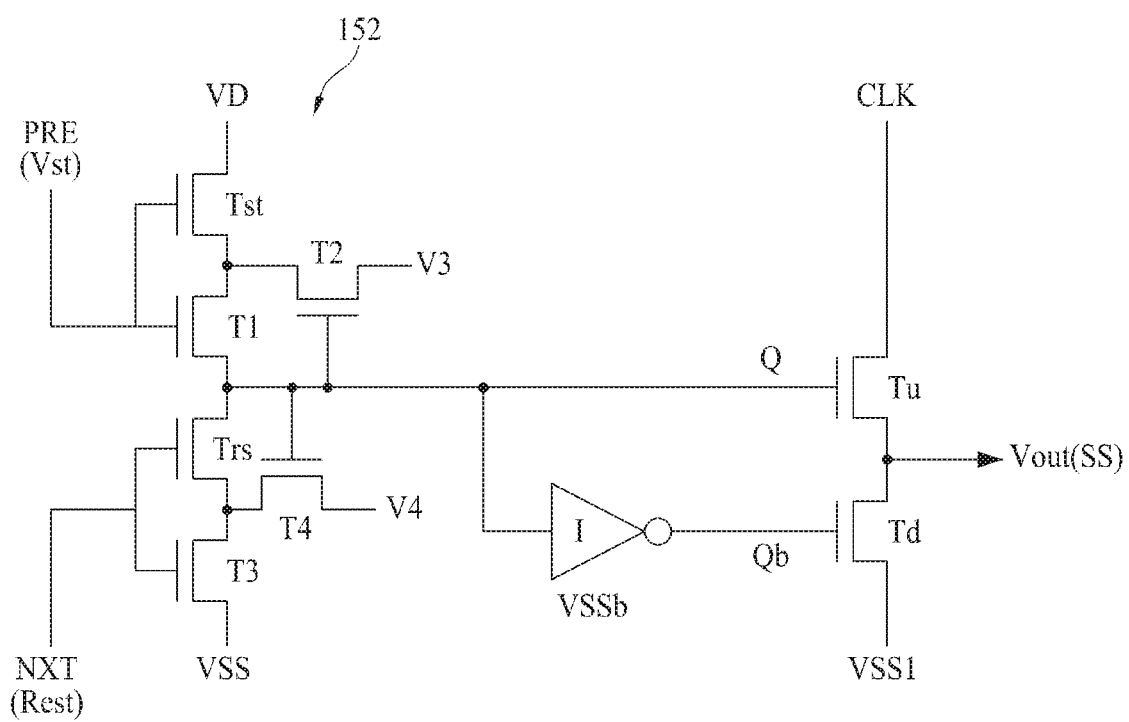
FIG. 9D is a circuit diagram illustrating a stage according to a comparative example, according to embodiment of the present disclosure.

FIG. 9D is a circuit diagram illustrating a stage 152 provided in the shift register using the thin film transistor (TFT0) according to the comparative example.

In comparison to the stage 151 of FIG. 3, the stage 152 of FIG. 9D further includes four thin film transistors (T1, T2, T3, T4).

A T1 thin film transistor is disposed between a start transistor (Tst) and a Q node, a T2 thin film transistor is disposed between the start transistor (Tst) and a third voltage (V3), a T3 thin film transistor is disposed between a reset transistor (Trs) and a low potential voltage (VSS), and a T4 thin film transistor is disposed between the reset transistor (Trs) and a fourth voltage (V4).

If the thin film transistor (TFT0) having the leakage current is used for the thin film transistor included in the stage 152 of the shift register 150, the transistors (T1, T2, T3, T4) configured to prevent the leakage current have to be additionally disposed. In this situation, a circuit system of the stage 152 becomes complicated, and an area of the stage 152 is increased. As a result, a structure of the shift register 150 and gate driver 120 is complicated, and an area of the shift register 150 and gate driver 120 is increased.

In addition, if the thin film transistors (TFT1, TFT2, TFT3, TFT4) according to the embodiments of the present disclosure are used for the thin film transistors included in the stage 151 of the shift register 150, it is unnecessary to disposed additional transistors (T1, T2, T3, T4) configured to prevent the leakage current. Thus, a circuit system of the stage 151 is simplified, and an area of the stage 151 is reduced. As a result, a structure of the shift register 150 and gate driver 120 can be simplified, and the shift register 150 and gate driver 120 can be formed on a small area of the substrate 100.

Figure 10:
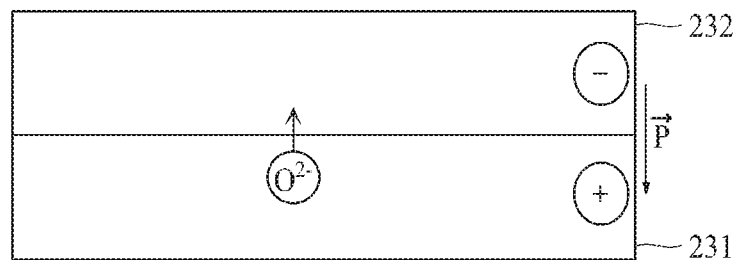
FIG. 10 is a schematic view illustrating an occurrence principle of a dipole moment according to another embodiment of the present disclosure.

FIG. 10 is a schematic view illustrating an occurrence principle of the dipole moment in the thin film transistor substrate 200 according to another embodiment of the present disclosure.

As described above, in the interface between the first buffer layer 231 and the second buffer layer 232, the surface oxygen concentration of the first buffer layer 231 is higher than the surface oxygen concentration of the second buffer layer 232. Due to the difference of surface oxygen concentration, the oxygen transfer (including the oxygen ion) is generated in the interface between the first buffer layer 231 and the second buffer layer 232. In detail, some of oxygen ($O^{2-}$) included in the first buffer layer 231 having a high oxygen concentration can be transferred to the second buffer layer 232 having a low oxygen concentration. As a result, the positive (+) polarity can be generated in the surface of the first buffer layer 231, and the negative (−) polarity can be generated in the surface of the second buffer layer 232. Thus, the dipole moment ($\vec{p}$) can be formed between the first buffer layer 231 and the second buffer layer As shown in FIGS. 7 and 8, even though the surface oxygen concentration of the second gate insulating film 252 is higher than the surface oxygen concentration of the first gate insulating film 251, the dipole moment ($\vec{p}$) can be formed between the first gate insulating film 251 and the second gate insulating film 252.

By the dipole moment ($\vec{p}$), a Fermi Level ($E_f$) of the semiconductor layer 240 can be changed.

Figure 11A:
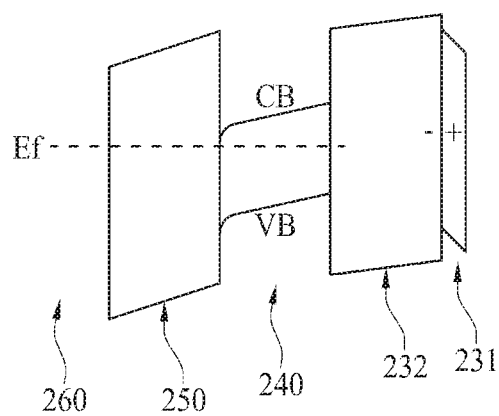
FIG. 11A is an energy band diagram of a thin film transistor according to another embodiment of the present disclosure.
Figure 11B:
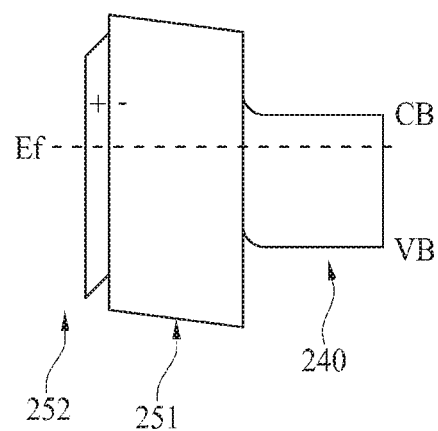
FIG. 11B is an energy band diagram of a thin film transistor according to another embodiment of the present disclosure.

FIG. 11A is an energy band diagram of the thin film transistor (TFT1) according to another embodiment of the present disclosure. FIG. 11B is an energy band diagram of the thin film transistor (TFT5) according to another embodiment of the present disclosure. FIG. 12 is a graph showing a drain current in accordance with a gate voltage in the thin film transistors (TFT0, TFT1) according to the comparative example and one embodiment of the present disclosure.

Referring to 11A, if the dipole moment ($\vec{p}$) is formed between the first buffer layer 231 and the second buffer layer 232, the Fermi level (Ef) of the semiconductor layer 240 of the oxide semiconductor material is transferred to the valence band (VB). As a result, as shown in FIG. 12, the threshold voltage of the thin film transistor (TFT1) is transferred to the positive direction.

Thus, it is possible to prevent the leakage current in the thin film transistor (TFT1).

FIG. 11B shows the Fermi level (Et) of the semiconductor layer 240 when the surface oxygen concentration of the second gate insulating film 252 is higher than the surface oxygen concentration of the first gate insulating film 251, as shown in FIG. 8.

Referring to FIG. 11B, if the dipole moment ($\vec{p}$) is formed between the first gate insulating film 251 and the second gate insulating film 252, the Fermi level (Ef) of the semiconductor layer 240 of the oxide semiconductor material is transferred to the valence band (VB). As a result, the threshold voltage of the thin film transistor (TFT5) is transferred to the positive direction so that it is possible to prevent the leakage current in the thin film transistor (TFT5).

The thin film transistors (TFT1, TFT2, TFT3, TFT4, TFT5) according to the embodiments of the present disclosure can be applied to the pixels of the display device.

Hereinafter, display devices 800, 900, 1000 and 1100 to be applied with the thin film transistors (TFT1, TFT2, TFT3, TFT4, TFT5) according to the embodiments of the present disclosure will be described as follows.

FIGS. 13 to 16 are circuit diagrams illustrating each pixel (P) applied to display devices according to other embodiments of the present disclosure.

The display device 800, 900, 1000 and 1100 according to other embodiment of the present disclosure includes a substrate 210, and a plurality of pixels (P) disposed on the substrate 210. The pixel (P) includes a pixel driver (PDC) on the substrate 210, and a display element connected with the pixel driver (PDC). The pixel driver (PDC) includes at least one thin film transistor (TR1c, TR1, TR2, TR3, TR4). The transistor (TR1c, TR1, TR2, TR3, TR4) can be formed of at least one among the thin film transistors (TFT1, TFT2, TFT3, TFT4, TFT5) shown in FIGS. 4 to 8.

In detail, the thin film transistor (TR1c, TR1, TR2, TR3, TR4) of the pixel (P) includes a first buffer layer 231 on the substrate 210, a second buffer layer 232 on the first buffer layer 231, a semiconductor layer 240 on the second buffer layer 232, and a gate electrode 260 spaced apart from the semiconductor layer 240 and at least a part of the gate electrode 260 overlaps with the semiconductor layer 240. In the interface between the first buffer layer 231 and the second buffer layer 232, a surface oxygen concentration of the first buffer layer 231 is higher than a surface oxygen concentration of the second buffer layer 232. A dipole moment is formed between the first buffer layer 231 and the second buffer layer 232.

Also, the thin film transistor (TR1c, TR1, TR2, TR3, TR4) of the pixel (P) can include a first gate insulating film 251 on the semiconductor layer 240, and a second gate insulating film 252 on the first gate insulating film 251. In the interface between the first gate insulating film 251 and the second gate insulating film 252, a surface oxygen concentration of the second gate insulating film 252 is higher than a surface oxygen concentration of the first gate insulating film 251. A dipole moment is formed between the first gate insulating film 251 and the second gate insulating film 252.

The thin film transistors (TFT1, TFT2, TFT3, TFT4, TFT5) and their components including the first buffer layer 231, the second buffer layer 232, the semiconductor layer 240, the gate electrode 260, the first gate insulating film 251, and the second gate insulating film 252 are described above, whereby a detailed description for the above thin film transistors (TFT1, TFT2, TFT3, TFT4, TFT5) and their components will be omitted.

Figure 13:
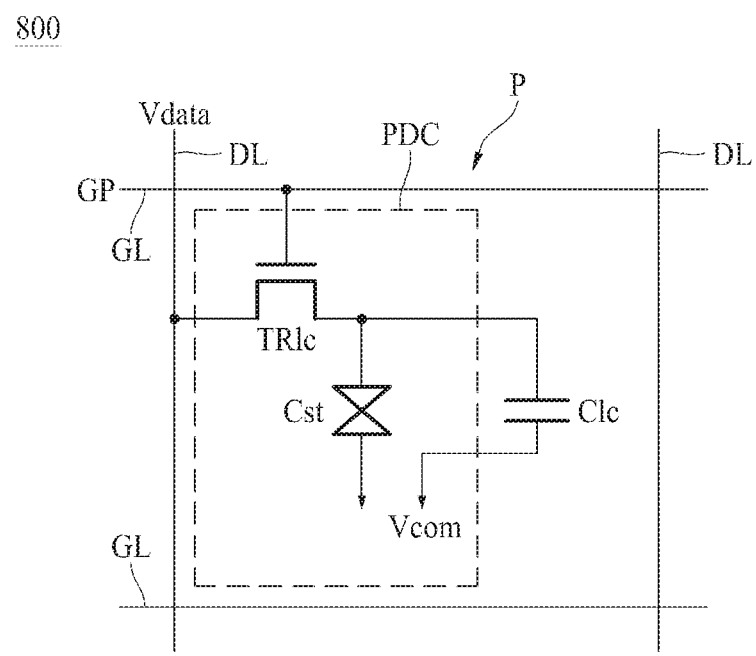
FIGS. 13 to 16 are circuit diagrams illustrating each pixel applied to display devices according to other embodiments of the present disclosure.

FIG. 13 is a circuit diagram illustrating a pixel (P) applied to a display device 800 according to another embodiment of the present disclosure. In detail, FIG. 13 is an equivalent circuit diagram for a pixel of a liquid crystal display device.

Referring to FIG. 13, the pixel (P) of the display device 800 includes a pixel driver (PDC), and a display element connected with the pixel driver (PDC). The display device 800 of FIG. 13 includes a liquid crystal capacitor (Clc) functioning as the display element.

The pixel driver (PDC) includes a thin film transistor (TR1c) connected with a gate line (GL) and a data line (DL), and a storage capacitor (Cst) connected between the thin film transistor (TR1c) and a common electrode. The liquid crystal capacitor (Clc) is connected with the storage capacitor (Cst) in parallel between the thin film transistor (TR1c) and the common electrode.

The liquid crystal capacitor (Clc) corresponding to the display element is charged with a differential voltage between a common voltage (Vcom) supplied to the common electrode and a data signal supplied to a pixel electrode through the thin film transistor (TR1c), and the liquid crystal capacitor (Clc) corresponding to the display element controls a light transmittance by driving liquid crystal in accordance with the charged voltage. The storage capacitor (Cst) stably maintains the voltage charged in the liquid crystal capacitor (Clc).

Figure 14:
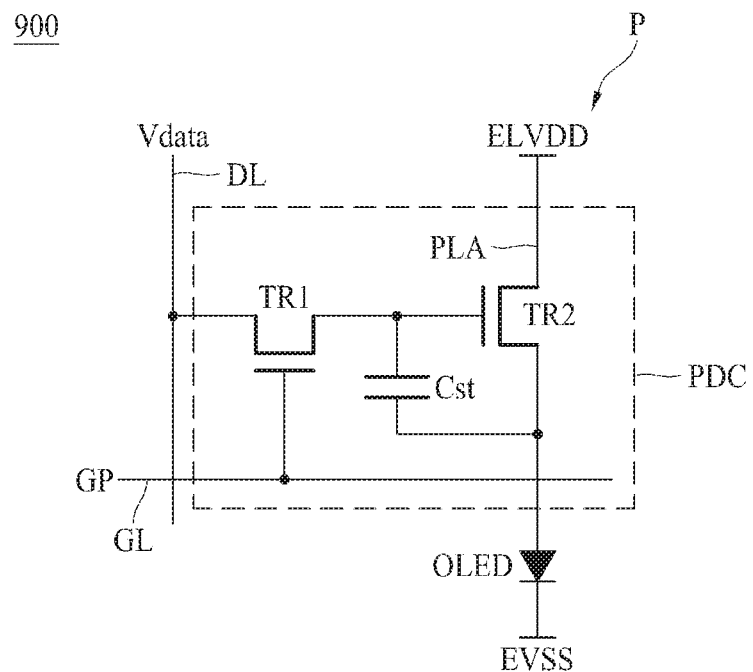

FIG. 14 is a circuit diagram illustrating a pixel (P) applied to a display device 90 according to another embodiment of the present disclosure. In detail, FIG. 14 is an equivalent circuit diagram for a pixel of an organic light emitting display device.

The pixel (P) of the display device 900 shown in FIG. 14 includes an organic light emitting diode (OLED) corresponding to a display element, and a pixel driver (PDC) configured to drive the organic light emitting diode (OLED). The organic light emitting diode (OLED) corresponding to the display element is connected with the pixel driver (PDC).

The pixel driver (PDC) includes a first thin film transistor (TRI) corresponding to a switching transistor, and a second thin film transistor (TR2) corresponding to a driving transistor.

The first thin film transistor (TRI) is connected with a gate line (GL) and a data line (DL), and the first thin film transistor (TR1) is turned-on or turned-off by a gate pulse (GP) supplied through the gate line (GL).

When the first thin film transistor (TRI) is turned-on, a data voltage (Vdata) supplied through the data line (DL) is supplied to a gate electrode of the second thin film transistor (TR2) connected with the organic light emitting diode (OLED). The data voltage (Vdata) is charged in a storage capacitor (Cst) formed between a source electrode and the gate electrode of the second thin film transistor (TR2).

An amount of current supplied to the organic light emitting diode (OLED) through the second thin film transistor (TR2) is controlled in accordance with the data voltage (Vdata), whereby it is possible to control a grayscale of light emitted from the organic light emitting diode (OLED).

Figure 15:
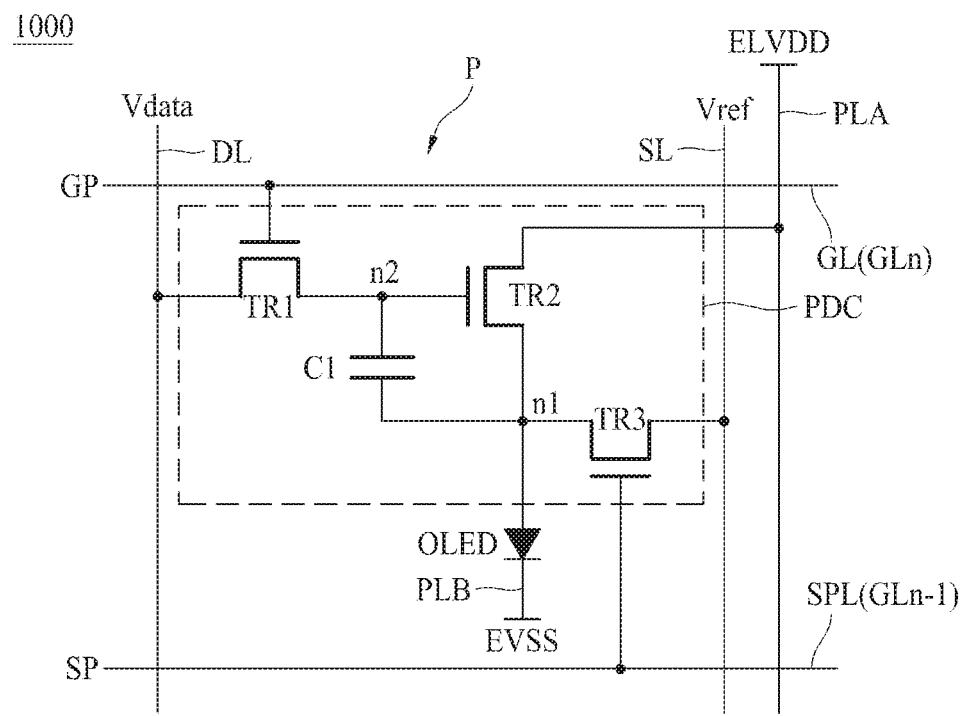

FIG. 15 is a circuit diagram illustrating a pixel (P) applied to a display device 1000 according to another embodiment of the present disclosure. In detail, FIG. 13 is an equivalent circuit diagram for a pixel of an organic light emitting display device.

The pixel (P) of the display device 1000 shown in FIG. 15 includes an organic light emitting diode (OLED) corresponding to a display element, and a pixel driver (PDC) configured to drive the organic light emitting diode (OLED). The organic light emitting diode (OLED) corresponding to the display element is connected with the pixel driver (PDC).

In the pixel (P), there are signal lines (DL, GL, PLA, PLB, SL, SPL) configured to supply a driving signal to the pixel driver (PDC).

A data voltage (Vdata) is supplied to a data line (DL), a gate pulse (GP) is supplied to a gate line (GL), a first driving power source (ELVDD) is supplied to a power supply line (PLA), a second driving power source (EVSS) is supplied to a driving power line (PLB), a reference voltage (Vref) is supplied to a sensing line (SL), and a sensing pulse (SP) is supplied to a sensing pulse line (SPL).

Referring to FIG. 15, when a gate line of the (n)th pixel (P) is referred to as "GL,", a gate line of the neighboring (n-1)th pixel (P) is "$GL_{n-1}$", and "$GL_{n-1}$" corresponding to the gate line of the (n-1)th pixel (P) serves as a sensing pulse line (SPL) of the (n)th pixel (P).

For example, as shown in FIG. 15, the pixel driver (PDC) includes a first thin film transistor (TR1, switching transistor) connected with the gate line (GL) and the data line (DL), a second thin film transistor (TR2, driving transistor) configured to control a level of current which is provided to the organic light emitting diode (OLED) in accordance with the data voltage (Vdata) transmitted through the first thin film transistor (TR1), and a third thin film transistor (TR3, sensing transistor) configured to sense the properties of the second thin film transistor (TR2).

A first capacitor (C1) is positioned between the organic light emitting diode (OLED) and a gate electrode of the second thin film transistor (TR2). The first capacitor (C1) is referred to as a storage capacitor (Cst).

According as the first thin film transistor (TR1) is turned-on by the gate pulse (GP) supplied to the gate line (GL), the first thin film transistor (TRI) transmits the data voltage (Vdata), which is supplied to the data line (DL), to the gate electrode of the second thin film transistor (TR2).

The third thin film transistor (TR3) is connected with the sensing line (SL) and a first node between the organic light emitting diode (OLED) and the second thin film transistor (TR2). The third thin film transistor (TR3) is turned-on or turned-off by a sensing pulse (SP), and the third thin film transistor (TR3) senses the properties of the second thin film transistor (TR2) corresponding the driving transistor for a sensing period.

A second node (n2) connected with the gate electrode of the second thin film transistor (TR2) is connected with the first thin film transistor (TR1). The first capacitor (C1) is formed between the second node (n2) and the first node (n1).

When the first thin film transistor (TR1) is turned-on, the data voltage (Vdata) supplied through the data line (DL) is supplied to the gate electrode of the second thin film transistor (TR2). The first capacitor (C1) formed between a source electrode and the gate electrode of the second thin film transistor (TR2) is charged with the data voltage (Vdata).

When the second thin film transistor (TR2) is turned-on, the current is supplied to the organic light emitting diode (OLED) through the second thin film transistor (TR2) from the first driving power source (ELVDD), whereby light is emitted from the organic light emitting diode (OLED).

Figure 16:
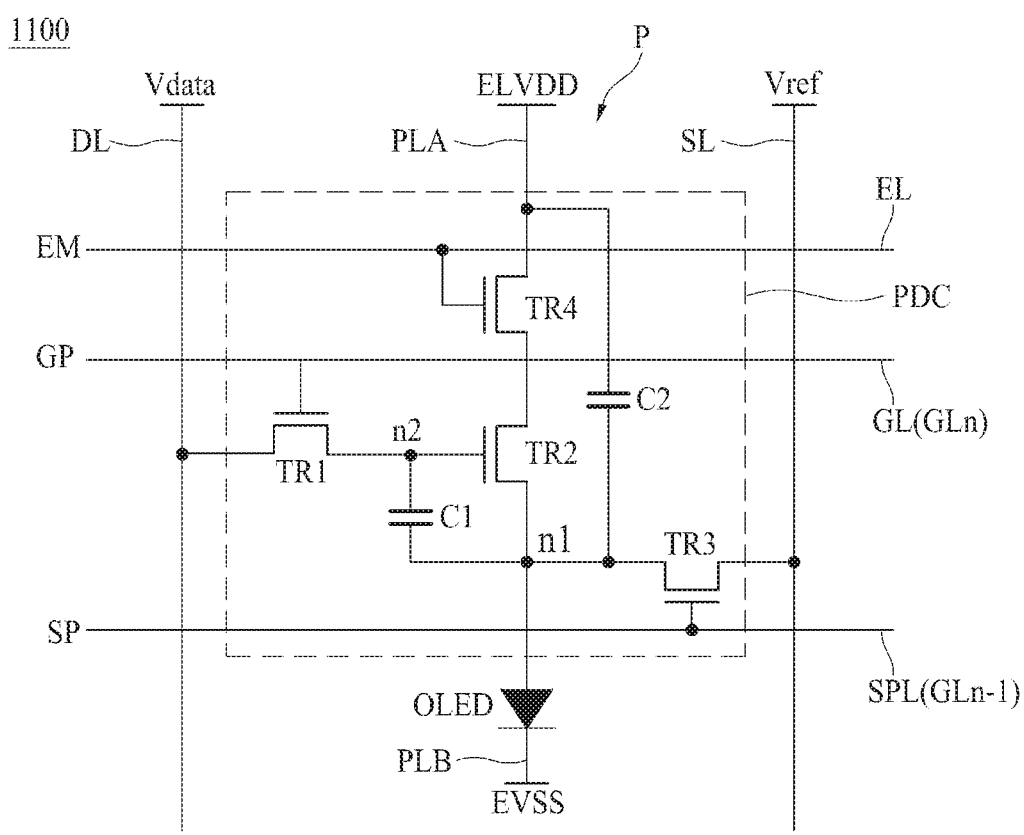

FIG. 16 is a circuit diagram illustrating a pixel (P) applied to a display device 1100 according to another embodiment of the present disclosure. In detail, FIG. 16 is an equivalent circuit diagram for a pixel (P) of an organic light emitting display device.

The pixel (P) of the display device 1100 shown in FIG. 16 includes an organic light emitting diode (OLED) corresponding to a display element, and a pixel driver (PDC) configured to drive the organic light emitting diode (OLED). The organic light emitting diode (OLED) corresponding to the display element is connected with the pixel driver (PDC).

The pixel driver (PDC) includes thin film transistors (TR1, TR2, TR3, TR4). According to another embodiment of the present disclosure, the thin film transistor (TR1, TR2, TR3, TR4) can be formed of at least one among the thin film transistors (TFT1, TFT2, TFT3, TFT4, TFT5) shown in FIGS. 4 to 8.

In the pixel (P), there are signal lines (DL, EL, GL, PLA, PLB, SL, SPL) for supplying a driving signal to the pixel driver (PDC).

In comparison to the pixel (P) of FIG. 15, the pixel (P) of FIG. 16 further includes an emission line (EL). An emission control signal (EM) is supplied to the emission line (EL). Also, in comparison to the pixel driver (PDC) of FIG. 15, the pixel driver (PDC) of FIG. 16 further includes a fourth thin film transistor (TR4) corresponding to an emission transistor configured to control a light emission time point of the second thin film transistor (TR2).

However, the embodiment of the present disclosure is not limited to the above structure. The pixel driver (PDC) can be formed in various structures generally known to those in the art. For example, the pixel driver (PDC) can include five or more thin film transistors.

Referring to FIG. 16, when a gate line of the (n)th pixel (P) is referred to as "$GL_n$", a gate line of the neighboring (n-1)th pixel (P) is "$GL_{n-1}$", and "$GL_{n-1}$" corresponding to the gate line of the (n-1)th pixel (P) serves as a sensing pulse line (SPL) of the (n)th pixel (P).

A first capacitor (C1) is positioned between an electrode of the organic light emitting diode (OLED) and a gate electrode of the second thin film transistor (TR2). The first capacitor (C1) is referred to as a storage capacitor (Cst). Also, a second capacitor (C2) is positioned between an electrode of the organic light emitting diode (OLED) and a terminal of the fourth thin film transistor (TR4), through which a first driving power source (ELVDD) is supplied.

According as the first thin film transistor (TR1) is turned-on by a gate pulse (GP) supplied to the gate line (GL), the first thin film transistor (TR1) transmits the data voltage (Vdata), which is supplied to the data line (DL), to a gate electrode 260 of the second thin film transistor (TR2).

The third thin film transistor (TR3) is connected with a sensing line (SL). The third thin film transistor (TR3) is turned-on or turned-off by a sensing pulse (SP), and the third thin film transistor (TR3) senses the properties of the second thin film transistor (TR2) corresponding the driving transistor for a sensing period.

The fourth thin film transistor (TR4) transmits the first driving power source (ELVDD) to the second thin film transistor (TR2), or blocks the first driving power source (ELVDD) in accordance with the emission control signal (EM). When the fourth thin film transistor (TR4) is turned-on, the current is supplied to the second thin film transistor (TR2), whereby light is emitted from the organic light emitting diode (OLED).

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

What is claimed is:

1. A thin film transistor substrate comprising:
   a buffer layer on a base substrate, the buffer layer including a first buffer layer and a second buffer layer;
   a semiconductor layer disposed on the buffer layer;
   a first gate insulating film disposed on the semiconductor layer;
   a second gate insulating film disposed on the first gate insulating; and
   a gate electrode spaced apart from the semiconductor layer, at least a part of the gate electrode overlapping with the semiconductor layer,
   wherein the first buffer layer is disposed on the base substrate and the second buffer layer is disposed on the first buffer layer,
   a surface oxygen concentration of the first buffer layer is higher than a surface oxygen concentration of the second buffer layer, and
   the semiconductor layer is between the buffer layer and the gate electrode, and
   wherein a surface oxygen concentration of the second gate insulating film is higher than a surface oxygen concentration of the first gate insulating film.

2. The thin film transistor substrate according to claim 1, wherein a dipole moment is formed between the first buffer layer and the second buffer layer.

3. The thin film transistor substrate according to claim 1, wherein the first buffer layer includes an ion bond, and the second buffer layer includes a covalent bond, and
   wherein a metal is involved in the ion bond of the first buffer layer.

4. The thin film transistor substrate according to claim 1, wherein the semiconductor layer includes an oxide semiconductor material.

5. The thin film transistor substrate according to claim 1, wherein the semiconductor layer includes a first semiconductor layer disposed on the buffer layer, and a second semiconductor layer disposed on the first semiconductor layer.

6. The thin film transistor substrate according to claim 1, wherein a dipole moment is formed between the first gate insulating film and the second gate insulating film.

7. The thin film transistor substrate according to claim 1, wherein the first gate insulating film includes a covalent bond, and the second gate insulating film includes an ion bond, and
   wherein a metal is involved in the ion bond of the first gate insulating film.

8. A display device comprising:
   a shift register disposed on a base substrate; and
   a pixel connected with the shift register,
   wherein the shift register includes a stage connected with the pixel through a gate line,
   wherein the stage includes at least one thin film transistor,
   wherein the at least one thin film transistor includes:
     a buffer layer on the base substrate, the buffer layer including a first buffer layer and a second buffer layer;
     a semiconductor layer disposed on the buffer layer;
     a first gate insulating film disposed on the semiconductor layer;
     a second gate insulating film disposed on the first gate insulating film; and
     a gate electrode spaced apart from the semiconductor layer, at least a part of the gate electrode overlapping with the semiconductor layer,
   wherein the first buffer layer is disposed on the base substrate and the second buffer layer is disposed on the first buffer layer,
   a surface oxygen concentration of the first buffer layer is higher than a surface oxygen concentration of the second buffer layer, and
   the semiconductor layer is between the second buffer layer and the gate electrode, and
   wherein a surface oxygen concentration of the second gate insulating film is higher than a surface oxygen concentration of the first gate insulating film.

9. The display device according to claim 8, wherein a dipole moment is formed between the first buffer layer and the second buffer layer.

10. The display device according to claim 8, wherein the first buffer layer includes an ion bond, and the second buffer layer includes a covalent bond, and
    wherein a metal is involved in the ion bond.

11. The display device according to claim 8, wherein the semiconductor layer includes an oxide semiconductor material.

12. The display device according to claim 8, wherein a dipole moment is formed between the first gate insulating film and the second gate insulating film.

13. A display device comprising:
    a plurality of pixels disposed on a base substrate,
    wherein each of the plurality of pixels includes:
      a pixel driver disposed on the base substrate; and
      a display element connected with the pixel driver,
    wherein the pixel driver includes at least one thin film transistor,
    wherein the at least one thin film transistor includes:
      a buffer layer on the base substrate, the buffer layer including a first buffer layer and a second buffer layer;
      a semiconductor layer disposed on the second buffer layer;
      a first gate insulating film disposed on the semiconductor layer;
      a second gate insulating film disposed on the first gate insulating film; and a gate electrode spaced apart from the semiconductor layer, at least a part of the gate electrode overlapping with the semiconductor layer, and wherein the first buffer layer is disposed on the base substrate and the second buffer layer is disposed on the first buffer layer, a surface oxygen concentration of the first buffer layer is higher than a surface oxygen concentration of the second buffer layer, and the semiconductor layer is between the second buffer layer and the gate electrode, and wherein a surface oxygen concentration of the second gate insulating film is higher than a surface oxygen concentration of the first gate insulating film.

14. The display device according to claim 13, wherein a dipole moment is formed between the first buffer layer and the second buffer layer.

15. The display device according to claim 13, wherein a dipole moment is formed between the first gate insulating film and the second gate insulating film.

* * * * *